United States Patent

[11] 3,621,466

[72] Inventor Toshio Misawa
New Providence, N.J.
[21] Appl. No. 883,897
[22] Filed Dec. 10, 1969
[45] Patented Nov. 16, 1971
[73] Assignee Bell Telephone Laboratories, Incorporated
Murray Hill, N.J.

[54] NEGATIVE RESISTANCE AVALANCHE DIODE STRUCTURES
2 Claims, 5 Drawing Figs.

[52] U.S. Cl. .......... 331/107 R, 317/234 V, 317/235 T
[51] Int. Cl. .......... H03b 7/14
[50] Field of Search .......... 331/107 R; 317/234 V, 235 T, 235 K; 307/322

[56] References Cited
OTHER REFERENCES

Irvin, " GaAs Avalanche Microwave Oscillators," IEEE Transactions on Electron Devices, Jan. 1966, pp. 208- 210 (331- 107)
Sze et al., " Metal-Semiconductor IMPATT Diode," Solid State Electronics, Feb. 1969, pp. 107- 109 (331- 107)

*Primary Examiner*—Roy Lake
*Assistant Examiner*—Siegfried H. Grimm
*Attorneys*—R. J. Guenther and Arthur J. Torsiglieri

ABSTRACT: Undesired electron trapping in a Read diode is prevented in one embodiment by using a *p+pnin+* structural configuration. In another embodiment, a metal–*nin+* configuration is used, with the metal-semiconductor interface forming Schottky barrier.

INVENTOR
T. MISAWA
BY
Robert B. Anderson
ATTORNEY

NEGATIVE RESISTANCE AVALANCHE DIODE STRUCTURES

BACKGROUND OF THE INVENTION

This invention relates to negative resistance avalanche diodes, and more particularly, to Read diodes.

The U.S. Pat. of Read, No. 2,899,652, describes how multilayer avalanche diodes can be made to present a negative resistance, and, when placed in a proper resonant circuit, generate microwave oscillations. An applied direct-current voltage biases a *p–n* junction to avalanche breakdown, thereby creating current pulses each of which travels across a transit region within a prescribed time period. This transit time is arranged with respect to the resonant frequency of the external resonator such that radiofrequency voltages at the diode terminals are out of phase with current pulses in the diode. With an appropriately designed phase shift, the current through the terminals increases as the voltage across the terminals decreases, thus establishing a negative resistance. Ultimately, part of the direct-current energy applied to the diode is converted to radio frequency energy in the resonator and the circuit constitutes a solid-state microwave source.

The Read diode is one of a class of diodes now generally known as IMPATT diodes, an acronym for impact avalanche and transit time. The Read diode is a four-layer structure such as a *p+nin+* configuration, in which the *p–n* junction is reverse-biased to avalanche. The *n* region is thin with respect to the *i* layer so that the current pulse will be well confined as is desirable for high efficiency. Best efficiency is obtained if the current density in the current pulse is high and current is 180° out of phase with the external voltage. The complementary configuration, a *n+pip+* structure, operates the same way.

While Read diodes have been operated successfully, they have never generated microwaves with the efficiency predicted by Read. I have found that the major cause of this inefficiency is "back-diffusion" of majority carriers in the current pulse, which occurs before it has drifted through the intrinsic or *i*-layer. Electrons of the current pulse tend to diffuse across the *p–n* junction and are trapped in the *p+* layer when the remainder of the current pulse is transmitted through the transit region. These trapped carriers then diffuse back across the *p–n* junction and reduce the time for formation of the succeeding current pulse; this disrupts the synchronism of the current pulse with the external voltage.

SUMMARY OF THE INVENTION

In accordance with my invention, the efficiency of Read diode structures is increased by including structure for preventing electron trapping as described above. In one embodiment, a *p*-conductivity layer is included between the *p+* layer and the *n* layer to yield a *p+pnin+* structure. The *p* layer is of significantly lower conductivity than the *p+* layer and must necessarily be subjected to a significant electric field even when the current pulse is drifting across the transit region. This electric field prevents electrons from being trapped in the *p* layer, and instead, forces them toward the positively biased contact. By making the *p* layer thicker than the diffusion length of a majority carrier, one can insure that diffusion to the *p+* layer is substantially precluded.

In accordance with another embodiment of the invention, a Schottky barrier contact is used for forming the avalanche junction; that is, the diode has a metal-*nin+* configuration. The diode works in the same manner as described before, with the voltage source reverse-biasing the Schottky barrier junction between the metal and the *n* layer. It is characteristic of the Schottky barrier that electron diffusion from the metal contact across the junction is substantially prohibited. Also, metal cannot trap electrons since it conducts electrons freely. Thus, the metal Schottky barrier contact substantially increases Read diode efficiency by eliminating the problem described before.

These and other objects, features and advantages of the invention will be better understood from a consideration of the following detailed description, taken in conjunction with the accompanying drawing.

DRAWING DESCRIPTION

DETAILED DESCRIPTION

Figure 1:
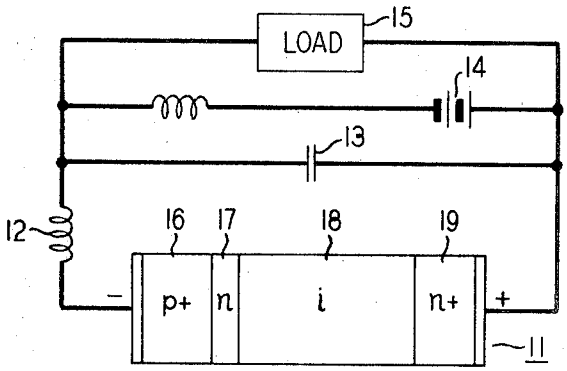
FIG. 1 PRIOR ART
FIG. 1 is a Read diode oscillator circuit in accordance with the prior art.

Referring now to FIG. 1, there is shown an oscillator circuit comprising a Read diode 11, an inductance 12, a capacitance 13, a bias source 14, and a load 15. As shown, the Read diode 11 comprises a wafer having successive layers 16, 17, 18, 19, of *p+*, *n*, *i*, and *n+* conductivity, respectively. The diode is located in the microwave resonator schematically represented by inductance 12 and capacitance 13. The rectifying *p–n* junction between the layers 16 and 17 is reverse-biased by voltage source 14. The oscillator circuit generates microwave oscillations that are transmitted for utilization to load 15.

Figure 1A:
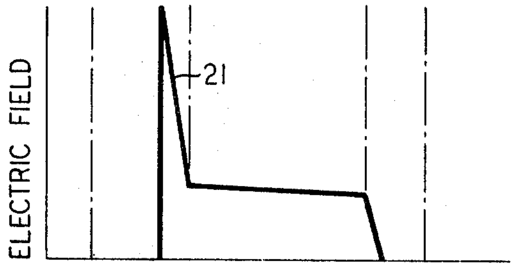
FIG. 1A is a graph of electric field distribution at one instant of time in the Read diode of FIG. 1.

Curve 21 of FIG. 1A shows the distribution of electric field with respect to distance in the Read diode 11. When the reverse-bias voltage is initially applied, the electric field is sufficiently high at the *p–n* junction between layers 16 and 17 to cause avalanche breakdown. This in turn forms a concentration of majority carrier electrons in layer 17 which drifts as a current pulse across intrinsic layer 18 to the positive diode contact. The frequency of the external microwave resonator is arranged, with respect to the transit time of the current pulse and the time taken for current pulse formation, such that the current in the diode is 180° out of phase with respect to the external diode voltage applied by the resonator. The *n* layer 17 is advantageously small with respect to the *i* layer 18 to give a sharp electric field peak at the junction and a sharply defined current pulse. As the current pulse drifts across the transit region defined by the intrinsic layer 18, the electric field at the *p–n* junction falls below the avalanche breakdown value. After the current pulse has reached the positive contact, the electric field at the *p–n* junction again reaches avalanche breakdown to form another current pulse, and the process repeats itself.

The *n* layer 17 is made thin with respect to the transit region defined by layer 18 to give a confined avalanche breakdown as is indicated in FIG. 1A, with a resulting confined current pulse of high current density. In theory, this permits the diode to be designed to give a 180° phase shift between the current pulse and the external voltage for maximum negative resistance and efficiency. Actually, it has been known for a number of years that the structure of FIG. 1 is incapable of generating a microwave output with efficiencies approaching those predicted by theory.

I have determined that the low efficiency results from back-diffusion of electrons in the current pulse. Any high density current concentration in a semiconductor tends to diffuse in both directions from the center of the concentration. In the device of FIG. 1, even though the electric field attracts the current pulse as a unit toward the positive contact, there is a significant diffusion current in the direction of the negative contact across the *p–n* junction. As shown in FIG. 1A, there is substantially no electric field in the *p+* layer 16 because of the high conductivity of that layer. Thus, electrons that may diffuse into layer 16 are trapped there because they are not influenced by any substantial electric field.

After the current pulse has moved into the layer 18 toward the positive contact, electrons in layer 16 tend to diffuse again across the *p–n* junction back into layer 17. These electrons reduce the time required for formation of the successive current pulse and thereby to reduce device efficiency.

Figure 2:
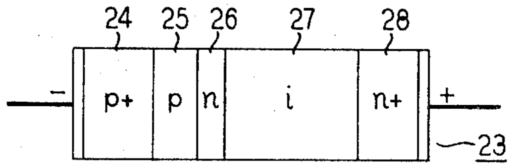
FIG. 2 is a schematic illustration of a Read diode in accordance with one embodiment of the invention.

FIG. 2 shows a diode 23, in accordance with the invention, that may be used in the circuit of FIG. 1 and comprises layers 24, 25, 26, 27, and 28 of *p*+, *p*, *n*, *i*, and *n*+ conductivity respectively. The diode differs from diode 11 essentially in the inclusion of the *p* layer 25 between *p*+ layer 24 and *n* layer 26. The *p*+ layer 24 permits a good ohmic contact to be made to the wafer, while *p* layer 25 insures the formation of a significant electric field between the *p*+ layer 24 and the *p–n* junction of layers 25 and 26.

Figure 2A:
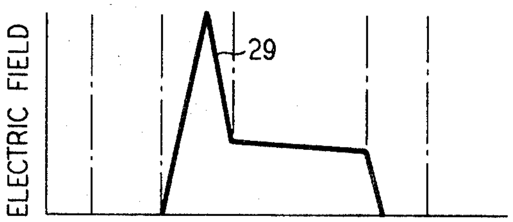
FIG. 2A is a graph of electric field distribution at one instant of time in the Read diode of FIG. 2.

The curve 29 of FIG. 2A shows the electric field established in diode 23 at the time of initial avalanche breakdown at the *p–n* junction. Because of the relatively lower conductivity of the *p* layer 25, the electric field extends through the *p* layer rather than dropping precipitously at the *p–n* junction as in FIG. 1A. A highly concentrated current pulse is formed in the *n*-type layer 26 and the diode operation is essentially the same as that in FIG. 1. However, electrons that may diffuse across the *p–n* junction into layer 25 are not trapped because they remain under the influence of the electric field. As such, they are attracted toward the positive contact immediately and will not interfere with the formation of a subsequent current pulse. Thus, just prior to the formation of the successive avalanche breakdown at the *p–n* junction, *n* layer 26 will be a "swept out" or depleted region which is free of majority carrier electrons, as is assumed in the proper design of a Read diode for optimum efficiency.

Diode 23 may typically be formed by epitaxial or diffused layers 24 through 27 formed on a silicon substrate 28. Typical dimensions are as follows:

layer 24—0.5 microns;
layer 25—0.4 microns;
layer 26—0.6 microns;
layer 27—4 microns; and
layer 28—50 microns.

The conductivities of the layers in carriers per cubic centimeter may be as follows:

layer 24—$10^{20}$,
layer 25—$6\times10^{16}$;
layer 26—$3\times10^{16}$;
layer 27—less than $10^{15}$; and
layer 28—$10^{20}$. Complementary silicon diodes with opposite conductivity types may be made with substantially the same dimensions and carrier concentrations as given above. That is, the diode may be of the form *n*+*npip*+. The diode could also be made of other well known semiconductor materials such as germanium, and could be modified in various other forms as would be apparent to one skilled in the art.

Figure 3:
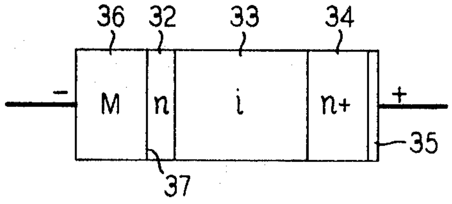
FIG. 3 is a schematic illustration of a Read diode in accordance with another embodiment of the invention.

Another structure for solving the problem of carrier trapping as shown in FIG. 3. The semiconductor wafer of the diode comprises layers 32, 33, and 34, of *n*, *i*, and *n*+ conductivity, respectively. Positive contact 35 is the usual ohmic contact, but contact 36 forms a Schottky barrier 37 with the *n* layer 32. Junction 37 is reverse-biased by the external voltage to avalanche and the diode works in the same manner as the diode of FIG. 1.

Back-diffusion of electrons across the junction 37 occurs as in the FIG. 1 embodiment, except that the metal contact 36 is incapable of trapping the electrons. That is, free electrons do not affect the atomic equilibrium of metal, and, after the current pulse leaves layer 32 in its transit across layers 33 and 34, no substantial diffusion across junction 37 can occur as a result of stored electrons in the metal contact 36. Hence, if the Schottky barrier junction 37 is well made with a minimum of "leakage," the *n* layer 32 can be substantially depleted of electrons prior to the formation of the succeeding current pulse and the diode is capable of operating with high efficiency.

The foregoing embodiments are intended merely to be illustrative of the invention concept. Other embodiments and modifications may be made by those skilled in the art without departing from the spirit and scope of the invention.

What is claimed is:

1. In a Read diode oscillator arrangement of the type comprising a semiconductor contained between first and second contacts and located within a cavity resonator, said semiconductor including in succession a rectifying junction, a relatively thin avalanche region of high conductivity, and a relatively thick transit region of low conductivity, the frequency of the cavity resonator being related to the transit time of the transit region, means for reverse-biasing the junction to cause temporary avalanche breakdown thereat with an accompanying formation of a concentration of majority carriers, the majority carriers being caused by the reverse-bias means to travel through the transit region to the second contact, whereafter the electric field in the diode is redistributed sufficiently to cause another avalanche breakdown at the junction, whereby the foregoing process repeats itself, the improvement comprising:

a first semiconductor layer and a second semiconductor layer contained between the first contact and the avalanche region;

the second layer forming the rectifying junction with the avalanche region and being of a substantially lower conductivity than the first semiconductor layer, whereby a substantial electric field extends through the second layer when the diode is reverse-biased, thereby preventing trapping of majority carriers between the first contact and the rectifying junction and thus improving the efficiency of the oscillator.

2. The improvement of claim 1 wherein:

the second layer is thicker than the diffusion length of a majority carrier of the avalanche region.

* * * * *